(12) United States Patent
Zhan

(10) Patent No.: US 8,824,987 B2
(45) Date of Patent: Sep. 2, 2014

(54) SQUELCH DETECTOR CIRCUIT AND METHOD

(75) Inventor: Hao-Jie Zhan, Hsinchu (TW)

(73) Assignee: Taiwan Semiconductor Manufacturing Co., Ltd., Hsin-Chu (TW)

(\*) Notice: Subject to any disclaimer, the term of this patent is extended or adjusted under 35 U.S.C. 154(b) by 400 days.

(21) Appl. No.: 13/191,512

(22) Filed: Jul. 27, 2011

(65) Prior Publication Data

US 2013/0029622 A1   Jan. 31, 2013

(51) Int. Cl.
*H04B 1/10* (2006.01)
*H03G 3/34* (2006.01)

(52) U.S. Cl.
CPC .................... *H03G 3/344* (2013.01)
USPC ............ 455/218; 455/212; 455/222; 455/283

(58) Field of Classification Search
CPC .................. H03G 3/341; H04B 1/56
USPC ......................................... 455/218
See application file for complete search history.

(56) References Cited

U.S. PATENT DOCUMENTS

| | | | |
|---|---|---|---|
| 5,303,408 A | 4/1994 | Ghomeshi et al. | |
| 6,653,892 B2 | 11/2003 | Park | |
| 6,859,645 B2 * | 2/2005 | Yu | 455/222 |
| 7,653,367 B2 * | 1/2010 | Song et al. | 455/218 |
| 2003/0001627 A1 * | 1/2003 | Simoni | 327/101 |
| 2007/0173216 A1 * | 7/2007 | Blum | 455/212 |

\* cited by examiner

*Primary Examiner* — Ajibola Akinyemi
(74) *Attorney, Agent, or Firm* — Duane Morris LLP

(57) ABSTRACT

A squelch detector includes a first circuit, a second circuit, and a comparator. The first circuit is configured to receive a first pair of differential input signals and in response output a second pair of differential signals. The second pair of differential signals have higher voltages than the first pair of differential input signals. The second circuit is coupled to the first circuit and is configured to extract first and second voltage levels from the second pair of differential signals. The comparator is configured to output a squelch level signal based on a comparison of the first voltage level and a third voltage level. The third voltage level is based on the second voltage level and a reference voltage.

22 Claims, 6 Drawing Sheets

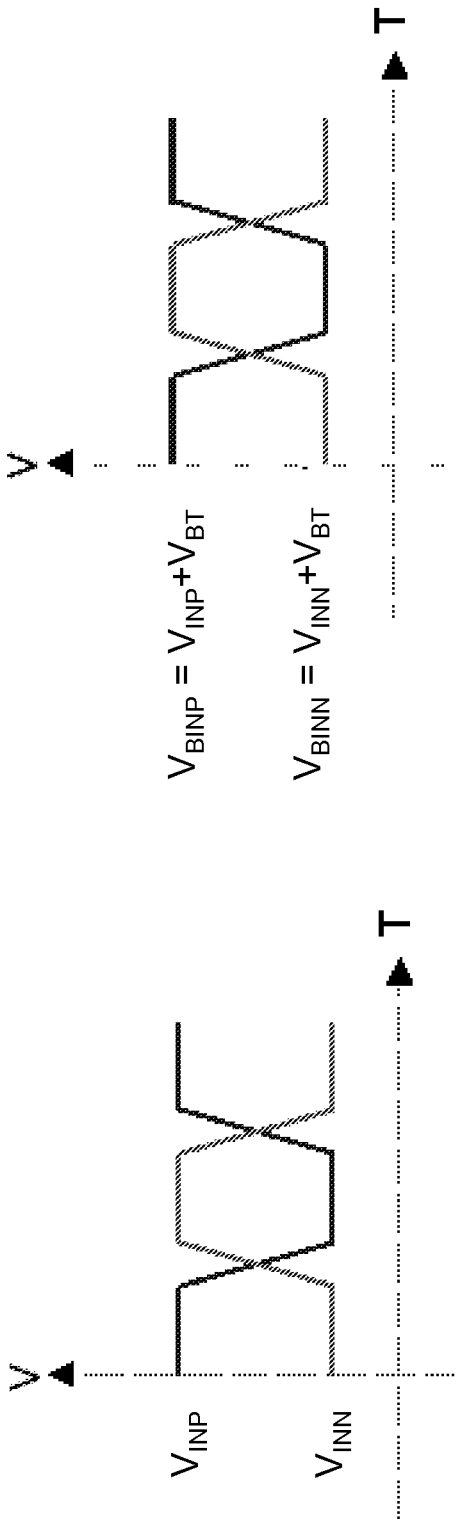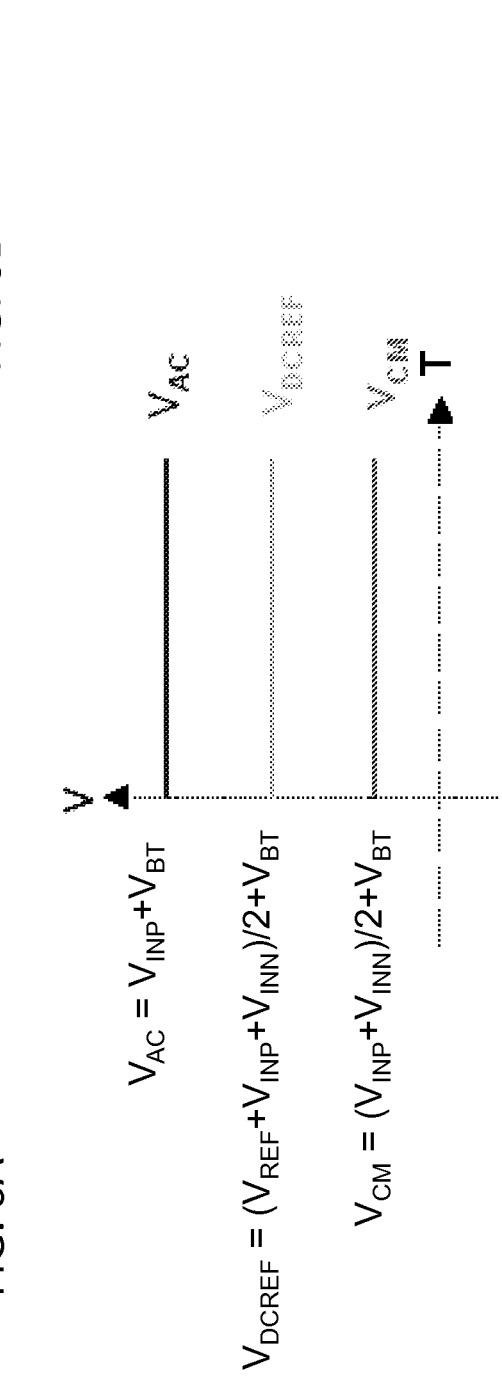
FIG. 6A
FIG. 6B
FIG. 6C

SQUELCH DETECTOR CIRCUIT AND METHOD

FIELD OF DISCLOSURE

The disclosed circuits and methods relate to integrated circuits. More specifically, the disclosed circuits and methods relate to squelch detectors for integrated circuits.

BACKGROUND

Squelch detectors are typically implemented in wireless receiver circuits to reduce signal noises. For example, once the noise in a received signal reaches or exceeds a value, the squelch detector stops the circuit from amplifying the signals such that the noise is not output by the receiver.

Squelch detectors may also be implemented in other integrated circuits such as, for example, universal serial buses ("USBs"). In USBs, squelch detector circuits are configured to detect input signals that are over a predetermined voltage. When a signal over the predetermined voltage is received, the squelch detector outputs a signal such that the USB operates in a different mode. However, such conventional squelch detector circuits are highly susceptible to variations in process, voltage, and temperature ("PVT"), which result in inaccurate and/or improper operation of the system in which the squelch detector is disposed.

BRIEF DESCRIPTION OF THE DRAWINGS

FIG. 6A illustrates one example of differential input signals received at the voltage boost circuit.

FIG. 6B illustrates one example of the differential signals output from the voltage boost circuit.

FIG. 6C illustrates one example of the relative levels of different signals of the improved squelch detector circuit illustrated in FIG. 1.

DETAILED DESCRIPTION

In some embodiments, squelch detectors and methods described herein advantageously enable implementation of a squelch level detector using a single direct current ("DC") voltage level comparator. The voltage boosting based on a differential input can accommodate a wide common-mode differential input signal range. A current-mode summation circuit is provided that does not suffer from variations in process, voltage, and temperature ("PVT") changes.

Figure 1:
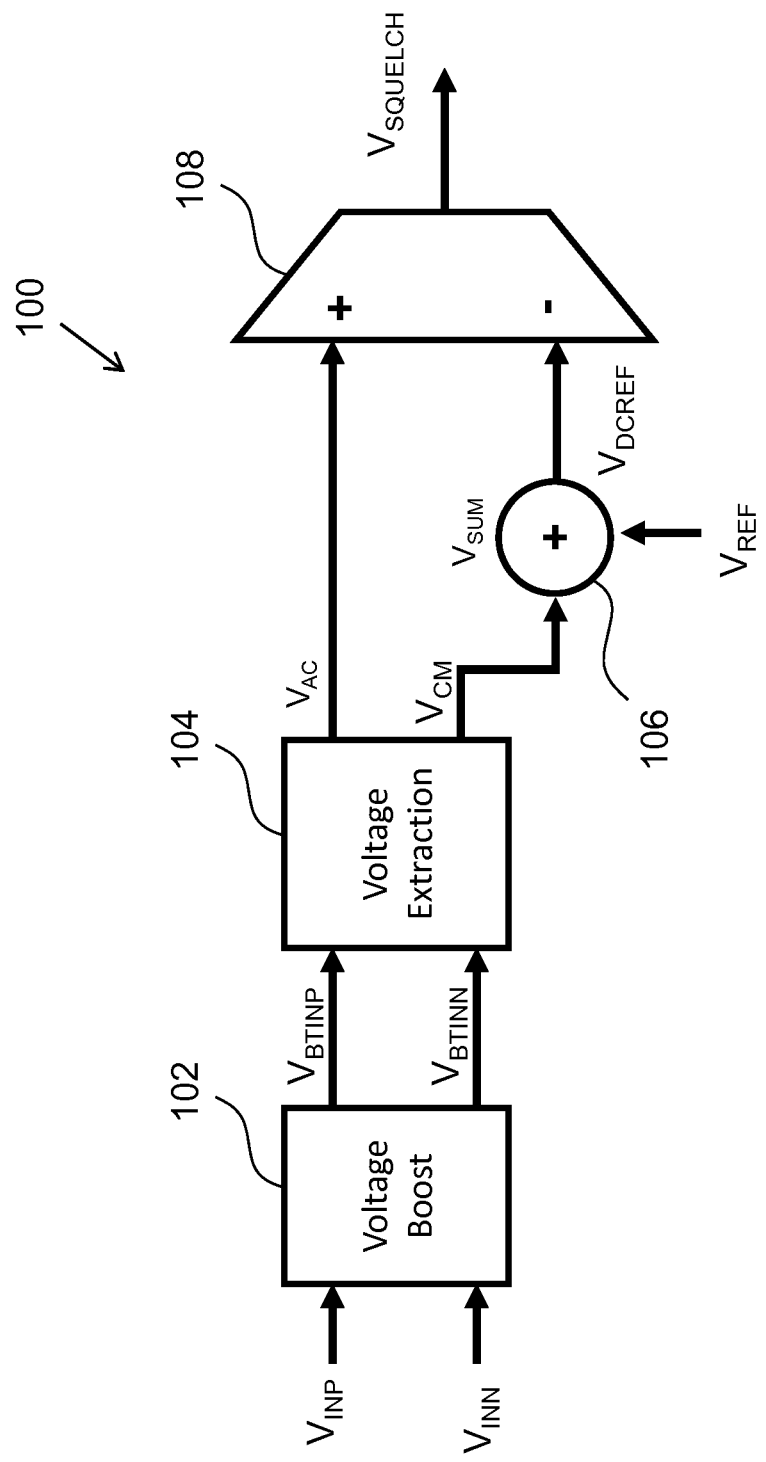
FIG. 1 is a block diagram of one example of an improved squelch detector circuit.

FIG. 1 illustrates one example of an improved squelch detection circuit 100. As shown in FIG. 1, squelch detection circuit 100 includes a voltage boost circuit 102 configured to receive a pair of differential input signals $V_{INP}$ and $V_{INN}$ and increase their respective voltage levels. For example, voltage boost circuit 102 increases the voltage of the differential input signals by a value of $V_{BT}$ and outputs boosted differential signals $V_{BINP}$ and $V_{BINN}$ in which $V_{BINP}$ is equal to $V_{INP}+V_{BT}$ and $V_{BINN}$ is equal to $V_{INN}+V_{BT}$. The boosted differential signals are output from voltage boost circuit 102 to voltage extraction circuit 104. Voltage extraction circuit 104 extracts lower alternating current ("AC") voltage, $V_{AC}$, and common-mode voltage, $V_{CM}$, signals from the boosted differential signals $V_{BINP}$ and $V_{BINN}$.

The extracted AC signal, $V_{AC}$, is output from extraction circuit 104 to a first input of comparator circuit 108. The common-mode voltage signal, $V_{CM}$, is output to a summing circuit 106, which also receives a reference voltage, $V_{REF}$, at a second input. Summing circuit 106 outputs a direct current ("DC") reference voltage, $V_{DCREF}$, to comparator 108, which compares a magnitude of the AC and DC signals, $V_{AC}$ and $V_{DCREF}$, and determines if the absolute value of the differential swing is smaller than a predetermined squelch reference potential.

Figure 2:
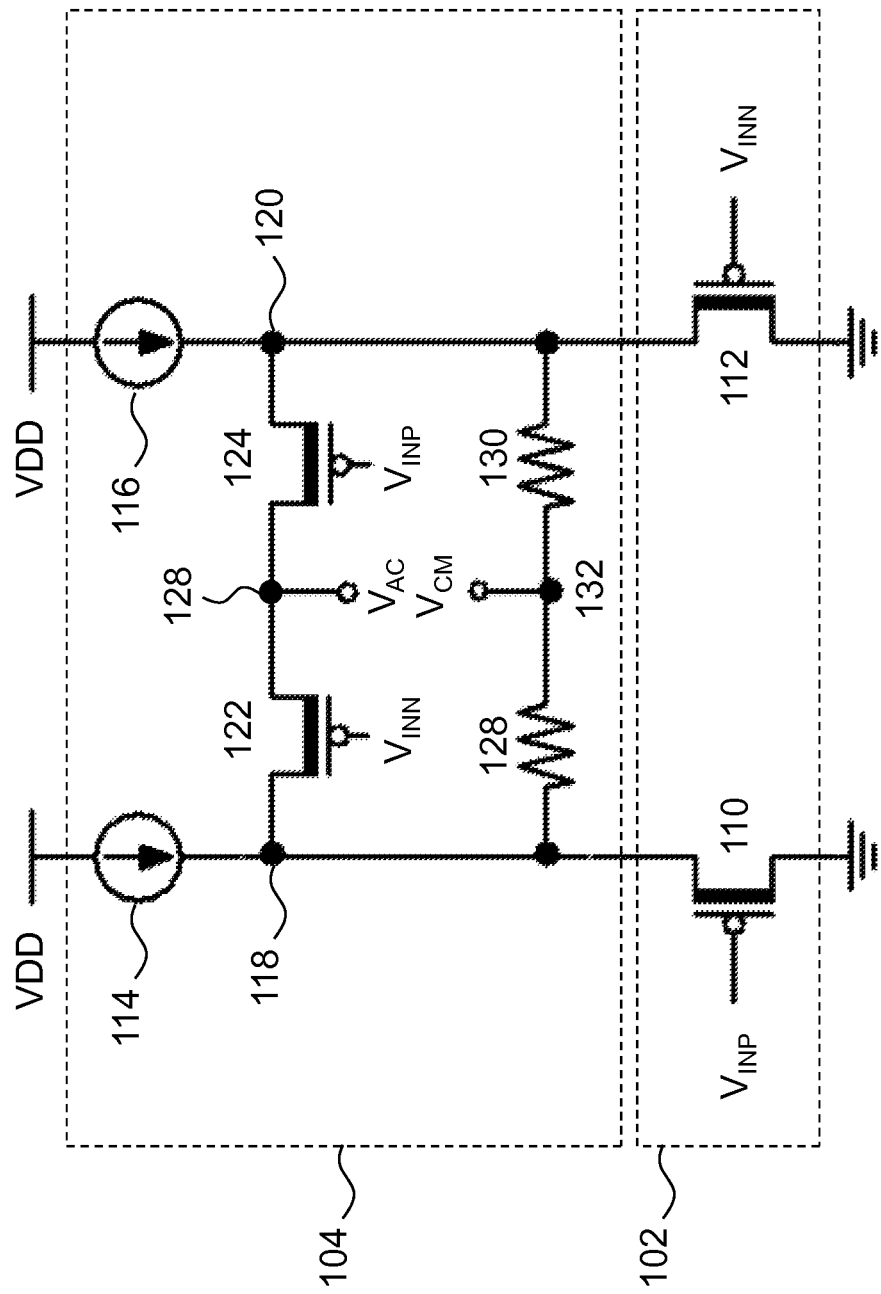
FIG. 2 is a circuit diagram of one example of a boost circuit and a voltage extraction circuit in accordance with the squelch detector circuit illustrated in FIG. 1.

FIG. 2 illustrates one example of the voltage boosting circuit 102 and voltage extraction circuit 104. As shown in FIG. 2, boosting circuit includes a first metal oxide field effect transistor ("MOSFET") of a first type 110, i.e., a p-type ("PMOS"), having a source coupled to ground, a drain coupled to extraction circuit 104, and a gate configured to receive positive differential input signal $V_{INP}$. Boosting circuit 102 also includes a second PMOS transistor 112 having a source coupled to ground, a drain coupled to extraction circuit 104, and a gate that receives negative differential input signal $V_{INN}$.

Extraction circuit 104 includes first and second current sources 114 and 116, which are respectively coupled between a first voltage source rail set at VDD and nodes 118 and 120. PMOS transistors 122 and 124 are coupled in series between nodes 118 and 120 and are coupled together at node 126, which is used to output $V_{AC}$ to comparator 108. PMOS transistor 122 receives $V_{INN}$ at its gate, and PMOS transistor 124 receives $V_{INP}$ at its gate. Resistors 128 and 130 are coupled together in series between nodes 118 and 120 such that resistors 128 and 130 are disposed in parallel with PMOS transistors 122 and 124. Resistors 128 and 130 are coupled together at node 132. Node 132 is used to output common-mode voltage $V_{CM}$ to summation circuit 106.

Figure 3:
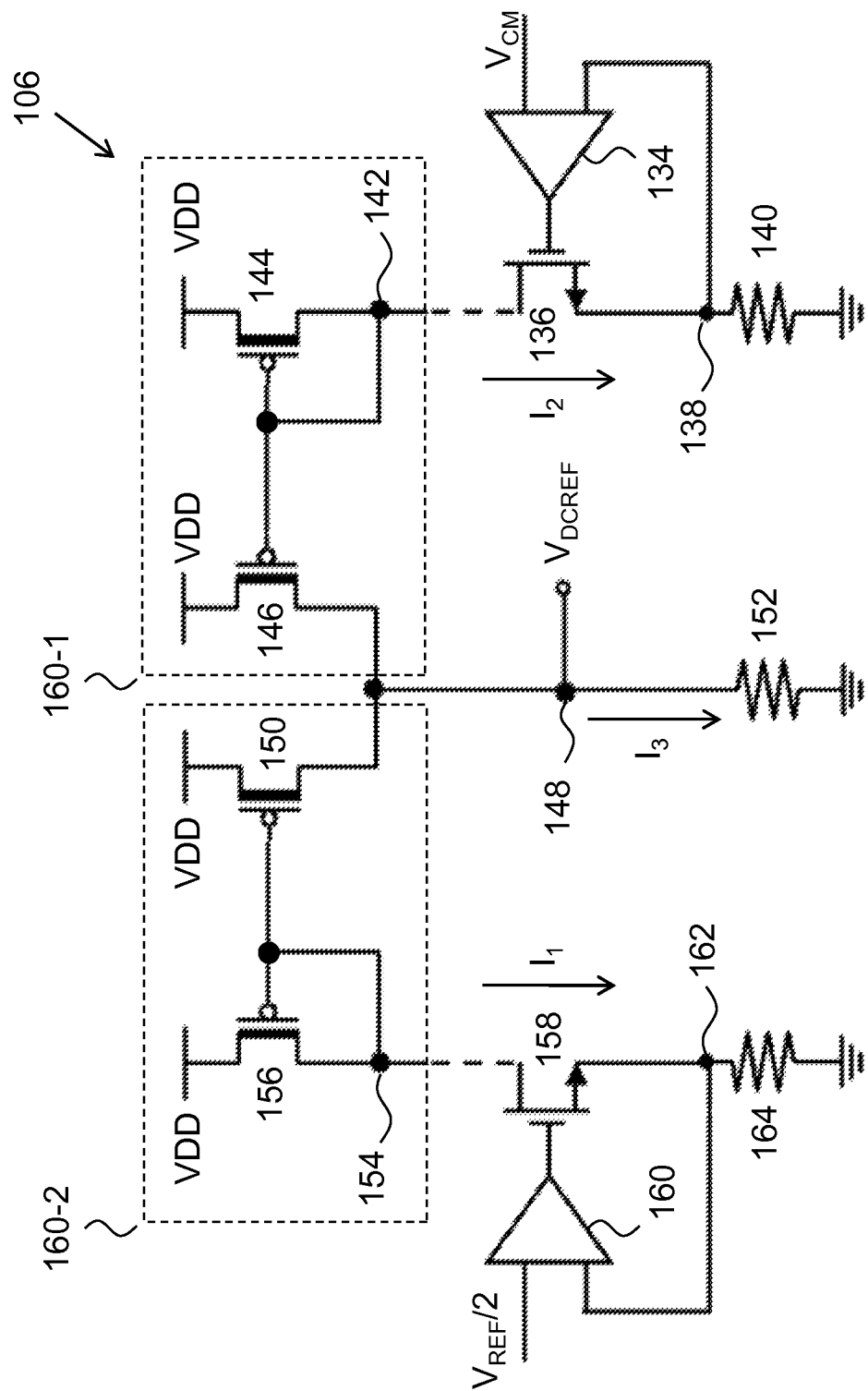
FIG. 3 is a circuit diagram of one example of a summation circuit in accordance with the squelch detector circuit illustrated in FIG. 1.

FIG. 3 illustrates one example of a summation circuit 106. As shown in FIG. 3, common mode voltage $V_{CM}$ is received at an input of operational amplifier ("opamp") 134, which has its output coupled to the gate of a NMOS transistor 136. The source of NMOS transistor 136 is coupled to node 138, which is coupled to resistor 140 and to a second input of opamp 134. The drain of NMOS transistor 136 is coupled to node 142, which is coupled to the drain and gate of PMOS transistor 144 and to the gate of PMOS transistor 146. The sources of PMOS transistors 144 and 146 are coupled to VDD.

The drain of PMOS transistor 146 is coupled to node 148, which is also coupled to the drain of PMOS transistor 150 and to resistor 152. Node 148 is used to output the DC reference voltage, $V_{DCREF}$, to comparator 108. The source of transistor 150 is coupled to VDD, and the gate of transistor 150 is coupled to node 154. Node 154 is coupled to the gate and drain of PMOS transistor 156, which has its source coupled to VDD, and to the drain of NMOS transistor 158. Transistor 158 has its gate coupled to an output of opamp 160 and its source coupled to node 162. Node 162 is coupled to resistor 164 and an input of opamp 160, which receives a reference voltage, $V_{REF}/2$, at another input.

Figure 4:
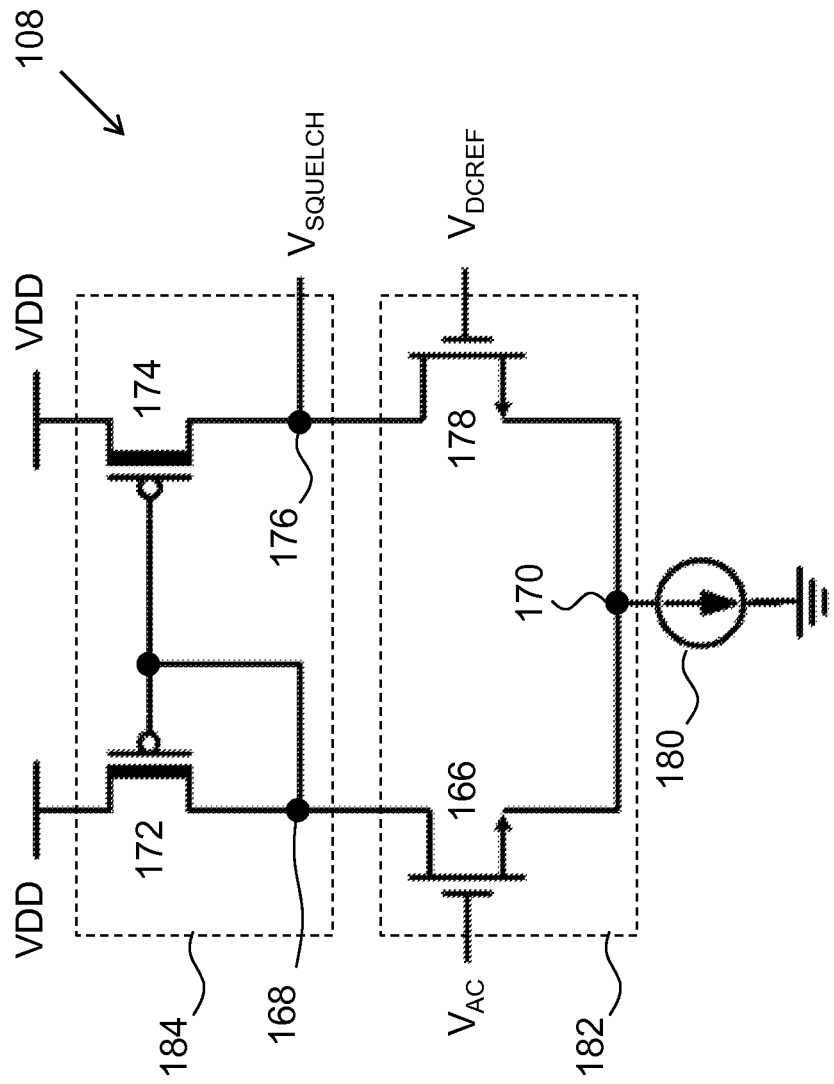
FIG. 4 is a circuit diagram of one example of a comparator circuit in accordance with the squelch detector circuit illustrated in FIG. 1.

FIG. 4 is a circuit diagram of one example of comparator 108. As shown in FIG. 4, comparator 108 includes a first NMOS transistor 166 configured to receive $V_{AC}$ at its gate and having its drain coupled to node 168 and its source coupled to node 170. Node 168 is coupled to the gate and drain of PMOS transistor 172 and to the gate of PMOS transistor 174. The sources of PMOS transistors 172 and 174 are coupled to a high voltage supply node set at VDD.

The drain of transistor 174 is coupled to node 176, which serves as the output node of comparator 108 and is also coupled to the drain of transistor 178. Transistor 178 receives $V_{DCREF}$ at its gate and has its source coupled to node 170, which is coupled to a current source 180.

Figure 5:
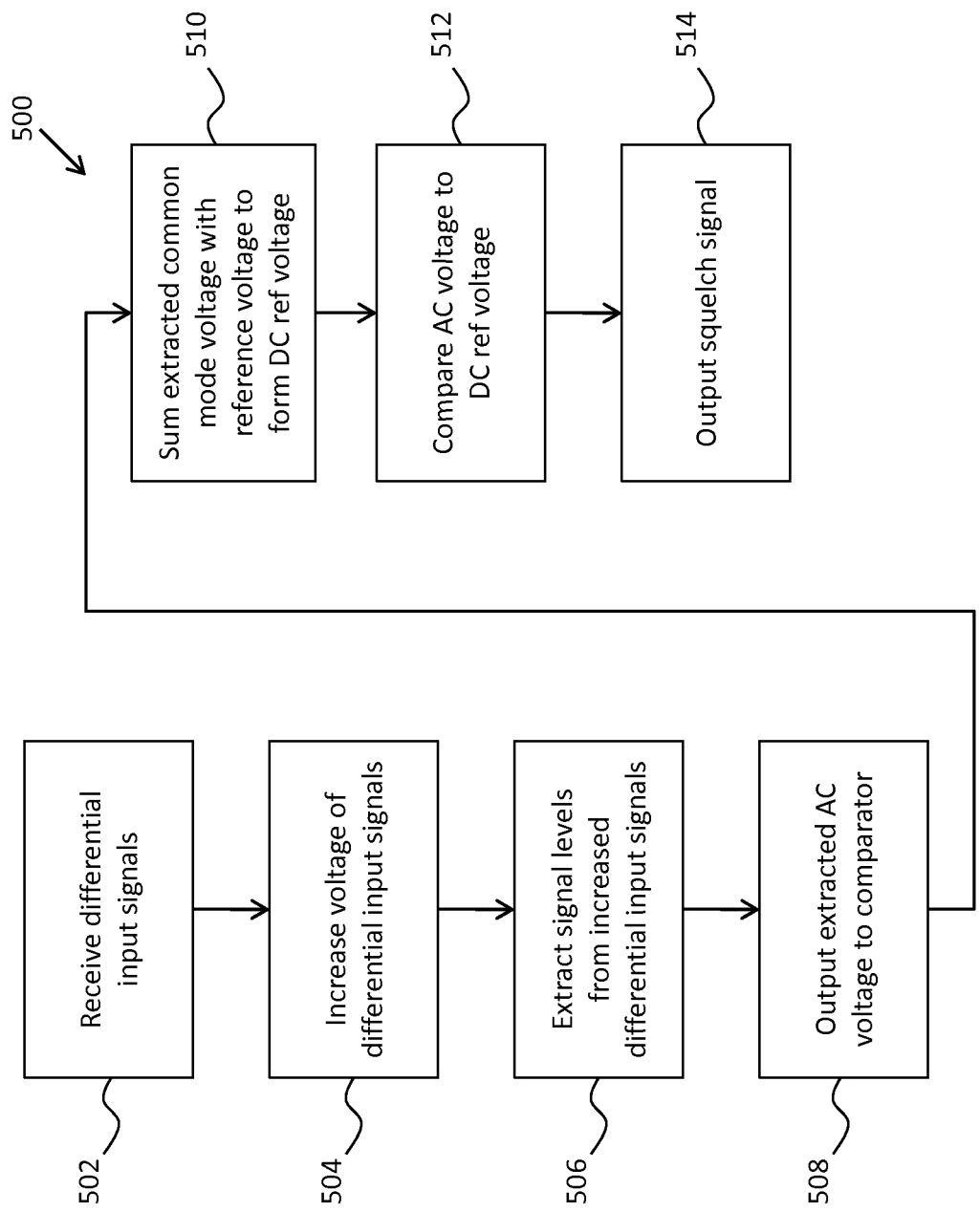
FIG. 5 is a flow diagram of one example of a method of generating a squelch signal in accordance with the squelch detector circuit illustrated in FIG. 1.

The operation of squelch detector circuit 100 is described with reference to FIG. 5, which is a flow diagram of one example of a method 500 of operation of squelch detector circuit 100. As shown in FIG. 5, differential input signals are received by squelch detector circuit 100 at block 502. For example, a first differential input signal, $V_{INP}$, is received at the gate of transistor 110, and a second differential input signal, $V_{INN}$, is received at the gate of transistor 112. FIG. 6A illustrates one example of the waveforms of $V_{INP}$ and $V_{INN}$ received at the respective gates of transistors 110 and 112.

At block 504, the voltage of the differential input signals is increased. As shown in FIG. 2, input signals $V_{INP}$ and $V_{INN}$ are received at the gates of transistors 110 and 112 such that transistors 110 and 112 are turned on, i.e., into a current-conducting state, and off, in a non-current-conducting state, based on the voltages of the differential input signals. When the voltage of differential signal $V_{INP}$ is greater than a threshold voltage of transistor 110, $V_{T110}$, then transistor 110 is off and the voltage at node 118 is approximately at VDD. When the voltage of differential signal $V_{INP}$ is less than threshold voltage of transistor 110, $V_{T110}$, then transistor 110 is on such that current from current source 114 passes through transistor 110 to ground. With transistor 110 on, the voltage at node 118 is pulled down to ground.

Similarly, transistor 112 is on when the voltage of $V_{INN}$ is less than the threshold voltage of transistor 112, $V_{T112}$, then transistor 112 is on such that current from current source 116 passes through transistor 112. With transistor 112 on, the voltage at node 120 is pulled to ground. When the voltage of $V_{INN}$ is above the threshold voltage of transistor 112, $V_{T112}$, then transistor 112 is off and the voltage at node 120 is approximately at VDD. FIG. 6B illustrates one example of the waveforms $V_{BINP}$ and $V_{BINN}$ output from boost circuit 102. In some embodiments, The boost voltage, $V_{BT}$, is based on the threshold voltages of PMOS transistors 110 and 112, e.g., $V_{T110}$ and $V_{T112}$.

Signal levels are extracted from the voltage-increased differential input signals at block 506. Referring again to FIG. 2, the common mode voltage, $V_{CM}$, is provided at node 132, which is disposed between resistors 128 and 130. The AC voltage, $V_{AC}$, is provided at node 128, which is disposed between transistors 122 and 124, which are selectively turned on and off based on the voltages $V_{INN}$ and $V_{INP}$ that are provided to their respective gates. As shown in FIG. 6C, $V_{AC}$ is equal to $V_{BINP}$ (i.e., $V_{INP}+V_{BT}$) and $V_{CM}$ is equal to half the sum of $V_{INP}$ and $V_{INN}$ plus the boosted voltage $V_{BT}$ (i.e., $(V_{INP}+V_{INN})/2+V_{BT}$).

At block 508, the AC voltage, $V_{AC}$, extracted from the increased differential input signals at block 506 is provided to comparator 108. For example, $V_{AC}$ is provided to the gate of transistor 166 of comparator 108 as shown in FIG. 4.

The common-mode voltage, $V_{CM}$, extracted at block 506 is summed with a reference voltage at block 510. As shown in FIG. 3, the common-mode voltage is provided to an input of opamp 134, which has its output coupled to the gate of transistor 136. Similarly, the reference voltage is provided to an input of opamp 160, which has its output coupled to the gate of transistor 158. The current $I_1$ is equal to the voltage supplied to the positive terminal of opamp 160 (i.e., $V_{REF}/2$) divided by the resistance of resistor 164 when transistor 158 is in a current-conducting on state, and the current $I_2$ is equal to the voltage supplied to the positive terminal of opamp 134 (i.e., $V_{CM}$) divided by the resistance of resistor 140 when transistor 136 is in a current-conducting on state.

Transistors 144 and 146 are configured to form a first current mirror 160-1 as the gate and drain of transistor 144 are coupled to node 142, which is also coupled to the gate of transistor 146. Transistors 150 and 156 form a second current mirror 160-2 as the gate and drain of transistor 156 are coupled together at node 154, which is also coupled to the gate of transistor 150. Currents $I_1$ and $I_2$ are mirrored such that they respectively flow through transistors 150 and 146, which are coupled together at node 148. The DC reference voltage provided at node 148 is based on the sum of currents $I_1$ and $I_2$, denoted as $I_3$, and the size of resistor 152. If the resistance of resistors 140, 152, and 164 are equal, then the voltage at node 148, $V_{DCREF}$, is equal to one-half the reference voltage plus the common mode voltage (i.e., $(V_{REF}/2)+V_{CM}$).

At block 512, the AC voltage, $V_{AC}$, is compared to $V_{DCREF}$ at comparator 108. As best seen in FIG. 4, comparator 108 receives the $V_{AC}$ at one input and $V_{DCREF}$ at a second input. Transistors 166 and 178 are configured to form a differential amplifier 182, which is coupled to the current mirror 184 formed by transistors 172 and 174. Comparator 108 outputs the squelch signal, $V_{SQUELCH}$, at block 514 based on the comparison at block 512. For example, if $V_{AC}$ is less than $V_{DCREF}$, then comparator 108 outputs a logic one. If $V_{AC}$ is greater than or equal to $V_{DCREF}$, then comparator 108 outputs a logic zero.

In some embodiments, a squelch detector includes a first circuit, a second circuit, and a comparator. The first circuit is configured to receive a first pair of differential input signals and in response output a second pair of differential signals. The second pair of differential signals have higher voltages than the first pair of differential input signals. The second circuit is coupled to the first circuit and is configured to extract first and second voltage levels from the second pair of differential signals. The comparator is configured to output a squelch level signal based on a comparison of the first voltage level and a third voltage level. The third voltage level is based on the second voltage level and a reference voltage.

In some embodiments, a method includes increasing a voltage of differential input signals in a first circuit to provide first and second signals, extracting first and second voltage levels from the first and second signals; receiving the first voltage level and a third voltage level, and outputting a squelch signal based on a difference between the first voltage level and the third voltage level. The third voltage level is based on the second voltage level and a reference voltage level.

In some embodiments, a squelch detector includes a first circuit configured to receive a first pair of differential input signals and in response output a second pair of differential signals. The second pair of differential signals have higher voltages than the first pair of differential input signals. A second circuit is coupled to the first circuit and is configured to receive the second pair of differential signals and extract first and second voltage levels. A third circuit is configured to output a third voltage level that is based on the second voltage level and a reference voltage level. A comparator is configured to output a squelch level signal based on a comparison of the first voltage level and the third voltage level.

The improved squelch detectors and methods described above advantageously enable implementation of a squelch level detector using a single DC voltage level comparator. The voltage boosting based on a differential input can accommodate a wide common-mode differential input signal range. A current-mode summation circuit is provided that does not suffer from variations in process, voltage, and temperature PVT changes.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A squelch detector, comprising:
a first circuit configured to receive a first pair of differential input signals and in response output a second pair of differential signals, the second pair of differential signals having higher voltages than the first pair of differential input signals;
a second circuit coupled to the first circuit and configured to extract first and second voltage levels from the second pair of differential signals; and
a comparator configured to output a squelch level signal based on a comparison of the first voltage level and a third voltage level, the third voltage level based on the second voltage level and a reference voltage,
wherein the first voltage level is an extracted alternating current ("AC") voltage signal and the second voltage level is a common-mode voltage signal.

2. The squelch detector of claim 1, wherein the first circuit includes:
a first transistor having a drain coupled to the second circuit, a source coupled to ground, and a gate configured to receive a first one of the first pair of differential input signals; and
a second transistor having a drain coupled to the second circuit, a source coupled to ground, and a gate configured to receive a second one of the first pair of differential input signals.

3. The squelch detector of claim 2, wherein the second circuit includes:
a first current source coupled to a first voltage supply and to a first node to which the drain of the first transistor is coupled;
a second current source coupled to the first voltage supply and to a second node to which the drain of the second transistor is coupled;
a third transistor having a source coupled to the first node, a drain coupled to a third node, and a gate configured to receive the first one of the first pair of differential input signals;
a fourth transistor having a source coupled to the second node, a drain coupled to the third node, and a gate configured to receive the second one of the first pair of differential input signals;
a first resistor coupled to the first node and to a fourth node; and
a second resistor coupled to the second node and to the fourth node.

4. The squelch detector of claim 3, wherein the third node outputs the first voltage level and the fourth node outputs the second voltage level.

5. The squelch detector of claim 1, further comprising a summation circuit configured to combine the second voltage level with a reference voltage.

6. The squelch detector of claim 5, wherein the summation circuit includes:
a first current mirror configured to generate a first current based on the reference voltage;
a second current mirror coupled to the first current mirror at a first node and configured to generate a second current based on the second voltage level; and
a resistor coupled to the first node that outputs the third voltage level based on a resistance of the resistor and a sum of the first and second currents.

7. The squelch detector of claim 1, wherein the comparator includes a current mirror coupled to a differential amplifier, the differential amplifier configured to output the squelch level signal based on a difference between the first voltage level and the third voltage level.

8. The squelch detector of claim 7, wherein
the current mirror includes:
a first transistor of a first type having a gate and a drain coupled together at a first node, and
a second transistor of the first type having a gate coupled to the first node and a drain coupled to an output node of the comparator; and
the differential amplifier includes:
a first transistor of a second type having a drain coupled to the first node, a source coupled to a second node, and a gate configured to receive the first voltage level, and
a second transistor of the second type having a drain coupled to the output node, a source coupled to the second node, and a gate configured to receive the third voltage level.

9. The squelch detector of claim 1, wherein the comparator is the only comparator in the squelch detector.

10. A method, comprising:
increasing a voltage of differential input signals in a first circuit to provide first and second signals;
extracting first and second voltage levels from the first and second signals;
receiving the first voltage level and a third voltage level, the third voltage level based on the second voltage level and a reference voltage level; and
outputting a squelch signal based on a difference between the first voltage level and the third voltage level,
wherein the first voltage level is an extracted alternating current ("AC") voltage signal and the second voltage level is a common-mode voltage signal.

11. The method of claim 10, further comprising summing the second voltage level with the reference voltage level.

12. The method of claim 11, wherein the summing is performed by a summation circuit that includes:
a first current mirror configured to generate a first current based on the reference voltage level;
a second current mirror coupled to the first current mirror at a first node and configured to generate a second current based on the second voltage level; and
a resistor coupled to the first node, the first node configured to output the third voltage level based on a resistance of the resistor and a sum of the first and second currents.

13. The method of claim 11, wherein summing the second voltage level with the reference voltage level at the fourth circuit includes:
generating a first current based on the reference voltage level;
generating a second current based on the second voltage level;
combining the first and second currents at a first node that is coupled to a resistor; and
outputting the third voltage level from the first node.

14. The method of claim 10, further comprising:
  receiving a first one of the differential input signals at a gate of a first transistor of the first circuit; and
  receiving a second one of the differential input signals at a gate of a second transistor of the first circuit.

15. The method of claim 14, wherein the extracting is performed by a second circuit that includes:
  a first current source coupled to a first voltage supply and to a first node to which the drain of the first transistor is coupled;
  a second current source coupled to the first voltage supply and to a second node to which the drain of the second transistor is coupled;
  a third transistor having a source coupled to the first node, a drain coupled to a third node, and a source configured to receive the first one of the differential input signals;
  a fourth transistor having a source coupled to the second node, a drain coupled to the third node, and a source configured to receive the second one of the differential input signals;
  a first resistor coupled to the first node and to a fourth node; and
  a second resistor coupled to the second node and to the fourth node.

16. A squelch detector, comprising:
  a first circuit configured to receive a first pair of differential input signals and in response output a second pair of differential signals, the second pair of differential signals having higher voltages than the first pair of differential input signals;
  a second circuit coupled to the first circuit and configured to receive the second pair of differential signals and extract first and second voltage levels;
  a third circuit configured to output a third voltage level that is based on the second voltage level and a reference voltage level; and
  a comparator configured to output a squelch level signal based on a comparison of the first voltage level and the third voltage level,
  wherein the first voltage level is an extracted alternating current ("AC") voltage signal and the second voltage level is a common-mode voltage signal.

17. The squelch detector of claim 16, wherein the first circuit includes:
  a first transistor having a drain coupled to the second circuit, a source coupled to ground, and a gate configured to receive a first one of the first pair of differential input signals; and
  a second transistor having a drain coupled to the second circuit, a source coupled to ground, and a gate configured to receive a second one of the first pair of differential input signals.

18. The squelch detector of claim 17, wherein the second circuit includes:
  a first current source coupled to a first voltage supply and to a first node to which the drain of the first transistor is coupled;
  a second current source coupled to the first voltage supply and to a second node to which the drain of the second transistor is coupled;
  a third transistor having a source coupled to the first node, a drain coupled to a third node, and a source configured to receive the first one of the first pair of differential input signals;
  a fourth transistor having a source coupled to the second node, a drain coupled to the third node, and a source configured to receive the second one of the first pair of differential input signals;
  a first resistor coupled to the first node and to a fourth node; and
  a second resistor coupled to the second node and to the fourth node.

19. The squelch detector of claim 16, wherein the third circuit includes:
  a first current mirror configured to generate a first current based on the reference voltage;
  a second current mirror coupled to the first current mirror at a first node and configured to generate a second current based on the second voltage level; and
  a resistor coupled to the first node, the first node configured to output the third voltage level based on a resistance of the resistor and a sum of the first and second currents.

20. The squelch detector of claim 16, wherein the comparator includes a current mirror coupled to a differential amplifier, the differential amplifier configured to output the squelch level signal based on a difference between the first voltage level and the third voltage level.

21. The squelch detector of claim 20, wherein
  the current mirror includes:
    a first transistor of a first type having a gate and a drain coupled together at a first node, and
    a second transistor of the first type having a gate coupled to the first node and a drain coupled to an output node of the comparator; and
  the differential amplifier includes:
    a first transistor of a second type having a drain coupled to the first node, a source coupled to a second node, and a gate configured to receive the first voltage level, and
    a second transistor of the second type having a drain coupled to the output node, a source coupled to the second node, and a gate configured to receive the third voltage level.

22. The squelch detector of claim 16, wherein the comparator is the only comparator in the squelch detector.

* * * * *